United States Patent [19]
Kobayashi et al.

[11] Patent Number: 5,296,669
[45] Date of Patent: Mar. 22, 1994

[54] SPECIMEN HEATING DEVICE FOR USE WITH AN ELECTRON MICROSCOPE

[75] Inventors: Hiroyuki Kobayashi, Mito; Takeo Kamino, Masahiro Tomita, both of Katsuta, all of Japan

[73] Assignees: Hitachi, Ltd., Tokyo; Hitachi Instruments Engineering Co, Ltd., Katsuta, both of Japan

[21] Appl. No.: 69,192

[22] Filed: May 28, 1993

[30] Foreign Application Priority Data

May 29, 1992 [JP] Japan ................................. 4-161946

[51] Int. Cl.⁵ .......................... H01J 37/20; H05B 3/02
[52] U.S. Cl. .................................. 219/201; 250/443.1
[58] Field of Search ................ 219/201; 250/442.11, 250/443.1; 359/395

[56] References Cited

U.S. PATENT DOCUMENTS

| | | | |
|---|---|---|---|
| 2,753,458 | 7/1956 | Kazato et al. | 250/443.1 |
| 3,624,390 | 11/1971 | Watanabe | 250/443.1 |
| 3,919,558 | 11/1975 | Brouillette et al. | 250/443.1 |
| 4,789,781 | 12/1988 | Kitagawa et al. | 250/443.1 |
| 4,950,901 | 8/1990 | Jones et al. | 250/443.1 |
| 5,241,415 | 8/1993 | Argentieri et al. | 359/395 |

FOREIGN PATENT DOCUMENTS

| | | |
|---|---|---|
| 51-267 | 1/1976 | Japan . |
| 58-173159 | 11/1983 | Japan . |
| 708280 | 1/1980 | U.S.S.R. ............... 359/395 |

*Primary Examiner*—Geoffrey S. Evans
*Attorney, Agent, or Firm*—Antonelli, Terry, Stout & Kraus

[57] ABSTRACT

A specimen to be irradiated with an electron beam is supported by a heating member secured detachably to a specimen holder and the heating member, a power supply therefor and electric conductive lines for conducting a electric power from the power supply to the heating member are integrated into the specimen holder.

7 Claims, 2 Drawing Sheets

SPECIMEN HEATING DEVICE FOR USE WITH AN ELECTRON MICROSCOPE

BACKGROUND OF THE INVENTION (1) Field of the Invention

The present invention relates to a specimen heating device for use with an electron microscope, and more particularly to a specimen heating device for use with an electron microscope which is suitable for observing a specimen in a high temperature state.

(2) Description of the Prior Art

Recently, it has been required to observe in a high temperature state a fine region or area of a specimen which is for example of the order of nanometers or less in diameter. In such an observation, it is very important to prevent the specimen from vibrating or drifting because the specimen drift adversely affects image resolving power directly.

According to one of known specimen heating devices, a sample is held by a specimen holding member heated by a heater. According to another known specimen heating device, a sample is held by a heater. A specimen heating device of the former type is disclosed in Japanese utility model application laid-open No. 173159/1983 and a specimen heating device of the latter type is disclosed in Japanese patent application laid-open No. 267/1976. The known specimen heating devices are advantageous in that the specimen is efficiently heated but disadvantageous in that the specimen is liable to vibrate or drift.

In general, a power supply for the heater is arranged independently of a main body of the electron microscope which is ordinarily called a column and hence electric conductors through which an electric power is supplied from the power supply to the heater are physically or mechanically unstable. As a result, the electric conductors are liable to be affected by air convection in the room in which the electron microscope is arranged and external vibration. That is, they are liable to be moved by the external factors. It has been found through experimental studies by the inventors that the specimen vibration or drift is attributed to the movement of the electric conductors.

SUMMARY OF THE INVENTION

One object of the present invention is to provide a specimen heating device for use with an electron microscope adapted to prevent a specimen from vibrating or drifting.

Another object of the present invention is to provide a specimen heating device for use with an electron microscope capable of heating a specimen efficiently.

Still another object of the present invention is to provide a specimen heating device for use with an electron microscope which is decreased in size.

According to the present invention, a specimen heating device for use with an electron microscope is provided which comprises a specimen holder for holding a specimen to be irradiated with an electron beam, a heating member for heating the specimen, a power supply, and electric conductor means for conductor an electric power from the power supply to the heating member, the heating member, the power supply and the electric conductor means being integrated into the specimen holder.

Other objects and features of the present invention will become apparent from the description of the preferred embodiments of the present invention in conjunction with the accompanying drawings.

DESCRIPTION OF THE PREFERRED EMBODIMENT

Figure 1:
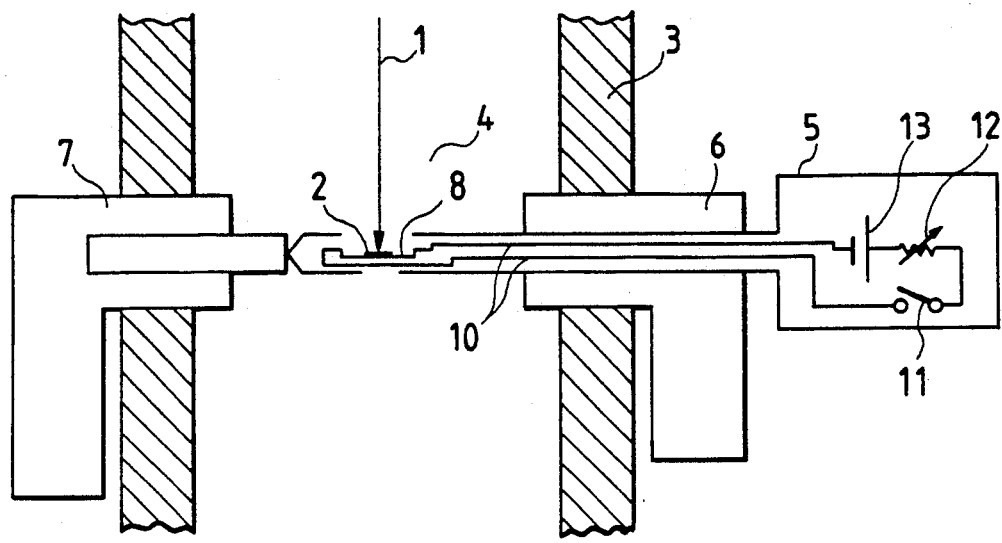
FIG. 1 is a schematic view, partly in section, of an embodiment of a specimen heating device for use with an electron microscope according to the present invention.

Referring to FIG. 1, a specimen 2 to be irradiated with an electron beam 1 is arranged in that evacuated chamber of a column 3 of an electron microscope which is maintained in a predetermined degree of vacuum. The specimen is held by a specimen holder 5, which is detachably secured to a specimen displacing device 6 supported by the column 3. The inner end of the specimen holder 5 is in contact with a specimen displacing device 7 supported by the column 3. The specimen displacing devices 6 and 7 serve to displace the specimen 2 on a plane substantially perpendicular to the axis of the electron beam 1 in a two-dimension and to rotate the specimen 2 around the axis of the specimen holder 6 for tilting the specimen 2 relative to the electron beam 1. The specimen displacing devices 6 and 7 are well known and therefore the details thereof are omitted in FIG. 1.

Figure 2:
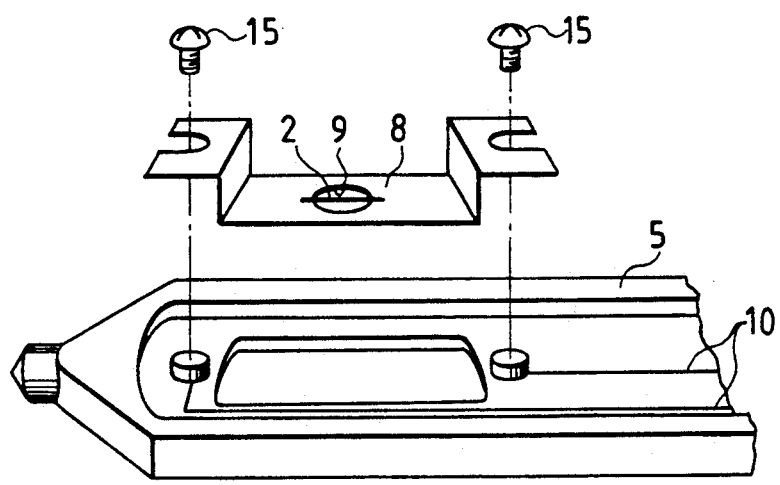
FIG. 2 is an exploded perspective view of a part of the specimen heating device shown in FIG. 1.

As being shown in FIG. 2, the specimen 2 is placed on a heating member 8 so as to be irradiated with the electron beam 1 which is passed through an electron beam passing aperture therein. The heating member 8 is made of the material of a high melting point such as tungsten and is small in thermal capacity so as to be effectively self-heated by being supplied with an electric power. The heating member 8 is plate-like and is fixed detachably to the specimen holder 6 by means of screws 15. The heating member 8 is further electrically connected to a DC power supply 13 through a switch 11 and a variable resister 12 by means of electric conductive lines 10. The DC power supply 13 may be a dry cell, the number of which is one or more. Integrated into the specimen holder 5 are the heating member 8, the electric conductive lines 10, the DC power supply 13, the switch 11 and the variable resister 12.

The electron beam 1 is emitted from an electron gun and focused on the specimen 2 by a condenser lens system to be thereby transmitted through the specimen 2. The transmitted electron beam 1 is projected onto a fluorescent screen disposed at a predetermined position by an image forming lens system so as to produce an enlarged visible image of the specimen 2 on the fluorescent screen. The electron gun, the condenser lens system, the image forming lens system and the fluorescent screen are omitted in FIGS. 1 and 2 because they are well known.

When the switch 11 is closed, since an electric power is applied to the heating member 8 through the variable resister 12, the heating member 8 is self-heated and therefore the specimen 8 is heated to a predetermined temperature. Thus, the specimen 8 is observed in a predetermined high temperature state. The temperature of the heated specimen 8 can be set by adjusting the variable resister 12 in accordance with the kind of the specimen 8 and the object of observation thereof.

As being stated above, the heating member 8, the electric conductive lines 10, the DC power supply 13, the switch 11 and the resister 12 are integrated into the specimen holder 5. It is thus apparent that specimen vibration or drift is not produced and therefore image resolving power is not affected. In addition, the specimen heating device may be reduced in size as a whole because of the using of the DC power supply composed of the dry cell.

The specimen 2 may be melted onto the heating member 8 and adhere thereto. In this case, the specimen 2 can easily replaced with a new one by detaching the heating member 8 from the specimen holder 5.

In the case where the specimen 2 is evaporated by heating, the evaporated specimen particles adhere to objects around the specimen 2 such as for example an objective lens, an electron beam diaphragm and so on and therefore their objects are contaminated.

Figure 3:
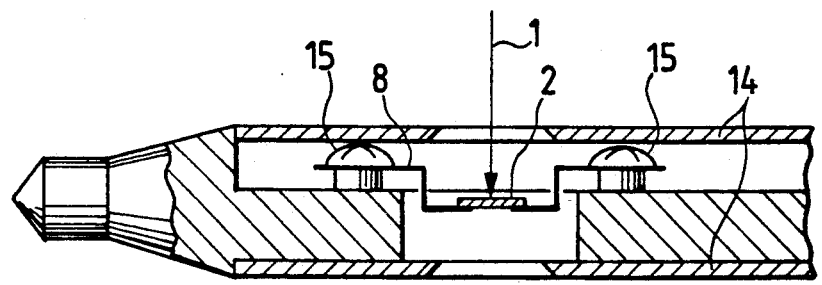
FIG. 3 is a vertical cross-sectional view of a part of a specimen heating device for use with an electron microscope showing another embodiment according to the present invention.

Referring to FIG. 3, specimen particle interrupting members 14 are so provided as to surround the specimen 2 and therefore the contamination of the objects around the specimen 2 due to the evaporated specimen particles is prevented because their particles are interrupted by the specimen particle interrupting members 14.

Figure 4:
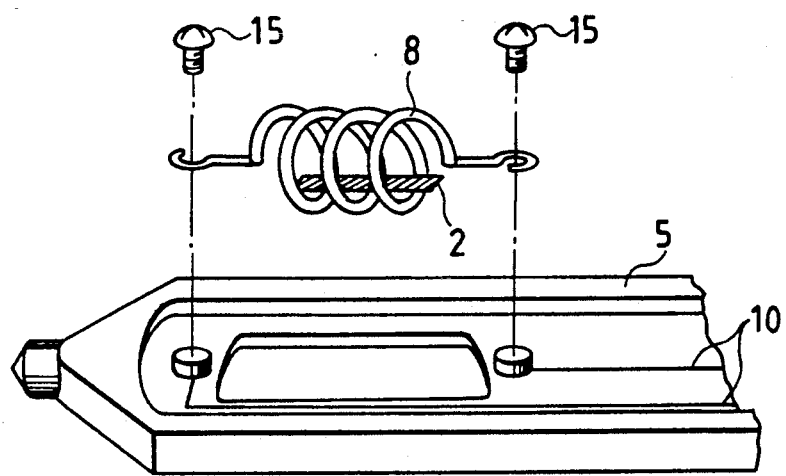
FIG. 4 is an exploded perspective view of a part of a specimen heating device for use with an electron microscope showing still another embodiment according to the present invention.

Referring to FIG. 4, the heating member 8 is of a spiral shape, in which the specimen 2 is disposed in contact therewith. According to this embodiment, the specimen 2 is surrounded by the spiral-shaped heating member 7 and therefore is effectively heated efficiently.

Since it is obvious that many changes and modifications can be made in the above described details without departing from the nature and spirit of the invention, it is to be understood that the invention is not to be limited to the details described herein.

What is claimed is:

1. A specimen heating device for use with an electron microscope, comprising a specimen holder for holding a specimen to be irradiated with an electron beam, a heating member for heating the specimen, a power supply, and electric conductor means for conducting an electric power from the power supply to the heating member, the heating member, the power supply and the electric conductor means being integrated into the specimen holder.

2. A specimen heating device for use with an electron microscope according to claim 1, wherein the specimen is supported by the heating member, the heating member being detachably secured to the specimen holder.

3. A specimen heating device for use with an electron microscope according to claim 2, wherein the heating member is heated by being supplied with the electric power.

4. A specimen heating device for use with an electron microscope according to claim 3, wherein the heating member is of a spiral shape, the specimen being disposed in the spiral-shaped heating member in contact therewith.

5. A specimen heating device for use with an electron microscope according to claim 3, wherein the power supply comprises a dry cell.

6. A specimen heating device for use with an electron microscope according to claim 4, wherein the heating member is of a spiral shape, the specimen being disposed in the spiral-shaped heating member in contact therewith and the power supply comprising a dry cell.

7. A specimen heating device for use with an electron microscope according to claim 1, 2, 3, 4, 5 or 6, further comprising means for interrupting possible vaporized particles of the specimen by heating.

* * * * *